(12) United States Patent
Lin et al.

(10) Patent No.: US 11,257,776 B2
(45) Date of Patent: Feb. 22, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Yung-Sheng Lin, Kaohsiung (TW); Chin-Li Kao, Kaohsiung (TW); Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/573,672

(22) Filed: Sep. 17, 2019

(65) Prior Publication Data
US 2021/0082853 A1 Mar. 18, 2021

(51) Int. Cl.
| | |
|---|---|
| *H01L 25/065* | (2006.01) |
| *H01L 25/16* | (2006.01) |
| *H01L 25/00* | (2006.01) |
| *H01L 25/18* | (2006.01) |
| *H01L 23/00* | (2006.01) |

(52) U.S. Cl.
CPC ............. *H01L 24/14* (2013.01); *H01L 24/11* (2013.01); *H01L 24/13* (2013.01); *H01L 24/17* (2013.01); *H01L 24/81* (2013.01); *H01L 24/94* (2013.01); *H01L 24/97* (2013.01); *H01L 2224/1146* (2013.01); *H01L 2224/11845* (2013.01); *H01L 2224/1357* (2013.01); *H01L 2224/13147* (2013.01); *H01L 2224/13564* (2013.01); *H01L 2224/13565* (2013.01); *H01L 2224/13582* (2013.01); *H01L 2224/13583* (2013.01); *H01L 2224/13611* (2013.01); *H01L 2224/13639* (2013.01); *H01L 2224/13647* (2013.01); *H01L 2224/13655* (2013.01); *H01L 2224/1403* (2013.01); *H01L 2224/1412* (2013.01); *H01L 2224/14505* (2013.01); *H01L 2224/17505* (2013.01); *H01L 2224/8183* (2013.01); *H01L 2224/81143* (2013.01); *H01L 2224/81815* (2013.01); *H01L 2224/81906* (2013.01)

(58) Field of Classification Search
CPC ....................................................... H01L 24/14
See application file for complete search history.

(56) References Cited

U.S. PATENT DOCUMENTS

| | | | |
|---|---|---|---|
| 2010/0327424 A1* | 12/2010 | Braunisch | ............... H01L 24/14 257/692 |
| 2015/0206865 A1* | 7/2015 | Yu | ........................... H01L 24/17 257/737 |
| 2019/0385977 A1* | 12/2019 | Elsherbini | ........... H01L 25/0652 |
| 2020/0098621 A1* | 3/2020 | Bharath | .............. H01L 25/0655 |

* cited by examiner

*Primary Examiner* — Omar F Mojaddedi
(74) *Attorney, Agent, or Firm* — Foley & Lardner LLP

(57) ABSTRACT

A semiconductor package structure includes a semiconductor die surface having a narrower pitch region and a wider pitch region adjacent to the narrower pitch region, a plurality of first type conductive pillars in the narrower pitch region, each of the first type conductive pillars having a copper-copper interface, and a plurality of second type conductive pillars in the wider pitch region, each of the second type conductive pillars having a copper-solder interface. A method for manufacturing the semiconductor package structure described herein is also disclosed.

20 Claims, 11 Drawing Sheets

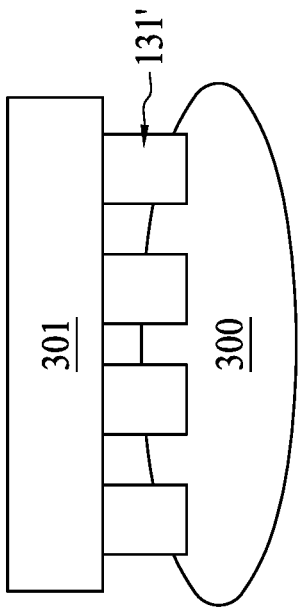
FIG. 3C1
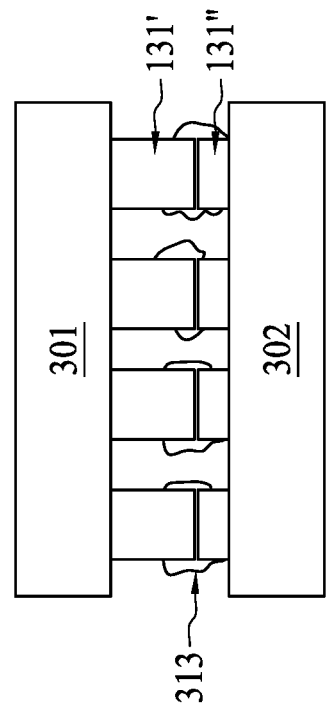
FIG. 3C2
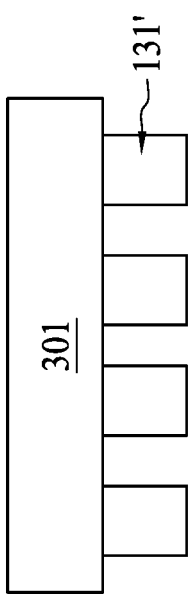
FIG. 3C3
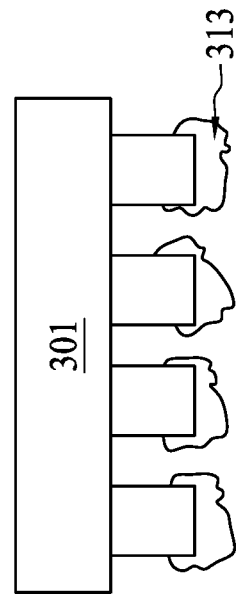
FIG. 3C4

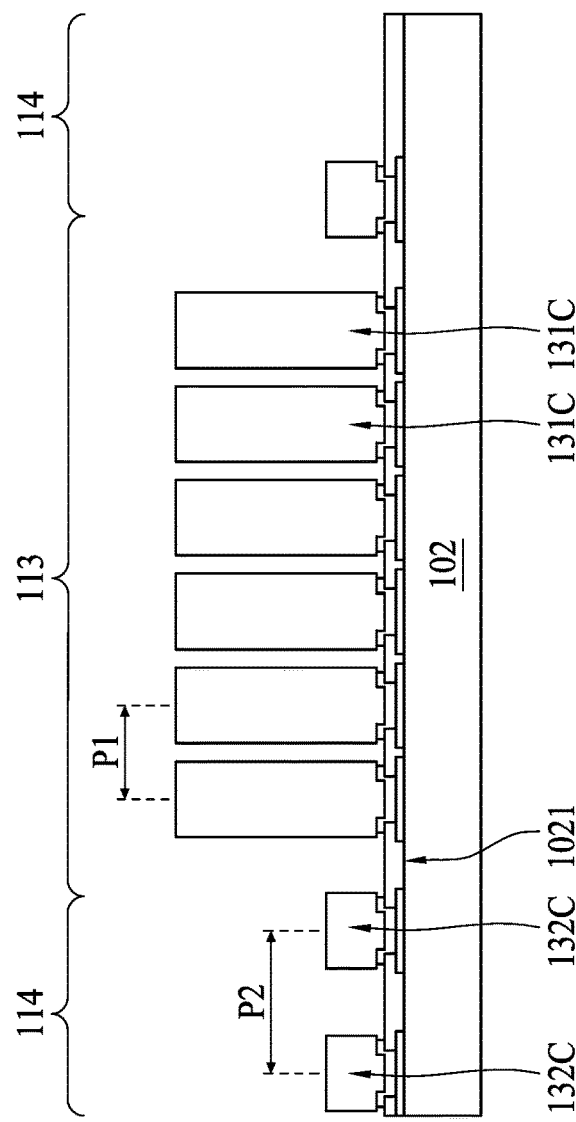
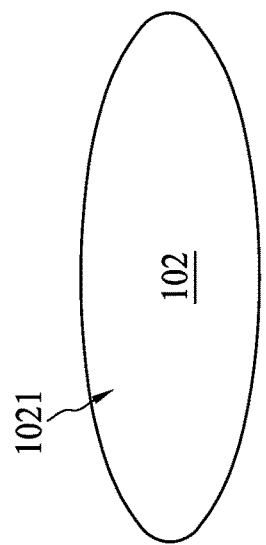
FIG. 5A
FIG. 5B
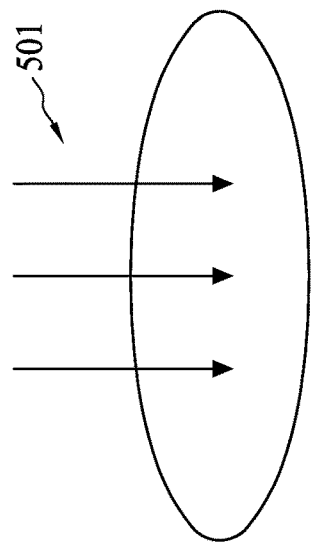
FIG. 5C
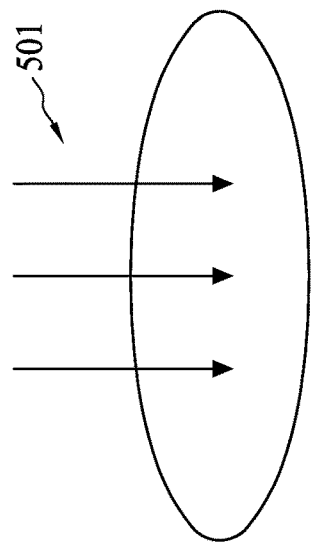
FIG. 5D

SEMICONDUCTOR PACKAGE STRUCTURE AND METHOD FOR MANUFACTURING THE SAME

BACKGROUND

1. Technical Field

The present disclosure relates to a semiconductor package structure having a metal-to-metal bonding and a metal-to-solder bonding.

2. Description of the Related Art

Semiconductor process technology has been progressing along a path towards ever-smaller device geometries, providing dramatic increases in the amount of circuitry which can be placed on a single-chip (e.g., increased circuit density). In general, the integrated circuit technology made available in the form of custom and semi-custom devices has followed this same path, providing ever-greater numbers of gates on a single chip at ever-lower costs. One particular type of semi-custom integrated circuit device is an ASIC (Application Specific Integrated Circuit), which typically includes standard-cell and gate-array technologies. It is now practical to provide ASICs with hundreds of thousands of gates, even in relatively low volumes.

To some extent, ASIC technology is the beneficiary of process technology advances in other areas such as memory and microprocessor technology. Trends in these areas have also been towards smaller device geometries and higher circuit density. Memory technology, particularly DRAM (Dynamic Random-Access-Memory) technology now routinely provides four to sixteen million bits of storage on a single memory chip. Microprocessor technology has advanced to the point where million-gate microprocessors are routinely available.

The above-referenced trends have generally been accompanied by increased demand for input/output (I/O) connections to the chip. Along with the increase of the I/O count, pitches between contact pads shrink and bridging between adjacent solder connection surfaces. In addition, lower contact resistance is specified especially for high I/O count product.

SUMMARY

In some embodiments, the present disclosure provides a semiconductor package structure, including a first carrier having a first surface, the first surface having a first region and a second region. The semiconductor package structure further includes a second carrier having a second surface opposing the first surface, the second surface having a third region corresponding to the first region and a fourth region corresponding to the second region. The semiconductor package structure further includes a plurality of first type conductive pillars between the first region of the first surface and the third region of the second surface, a plurality of second type conductive pillars between the second region of the first surface and the fourth region of the second surface. A contact resistance of each of the first type conductive pillars is lower than a contact resistance of each of the second type conductive pillars In some embodiments, the present disclosure provides a semiconductor package structure, including a semiconductor die surface having a narrower pitch region and a wider pitch region adjacent to the narrower pitch region, a plurality of first type conductive pillars in the narrower pith region, each of the first type conductive pillars having a copper-copper interface, and a plurality of second type conductive pillars in the wider pitch region, each of the second type conductive pillars having a copper-solder interface.

In some embodiments, the present disclosure provides a method for manufacturing a semiconductor package structure, including providing a first wafer having a first surface, plating a plurality of first conductive pillars in a first region and a plurality of second conductive pillars in the second region of the first surface, planarizing the plurality of first conductive pillars and the plurality of second conductive pillars, and selectively forming a solder bump on each of the plurality of second conductive pillars.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 3C1, FIG. 3C2, FIG. 3C3, and FIG. 3C4 illustrate cross sectional views of an intermediate semiconductor package structure during various manufacturing operations, according to some embodiments of the present disclosure.

FIG. 5A, FIG. 5B, FIG. 5C, and FIG. 5D illustrate various manufacturing operations of a portion of a semiconductor package structure, according to some embodiments of the present disclosure.

DETAILED DESCRIPTION

Figure 1A:
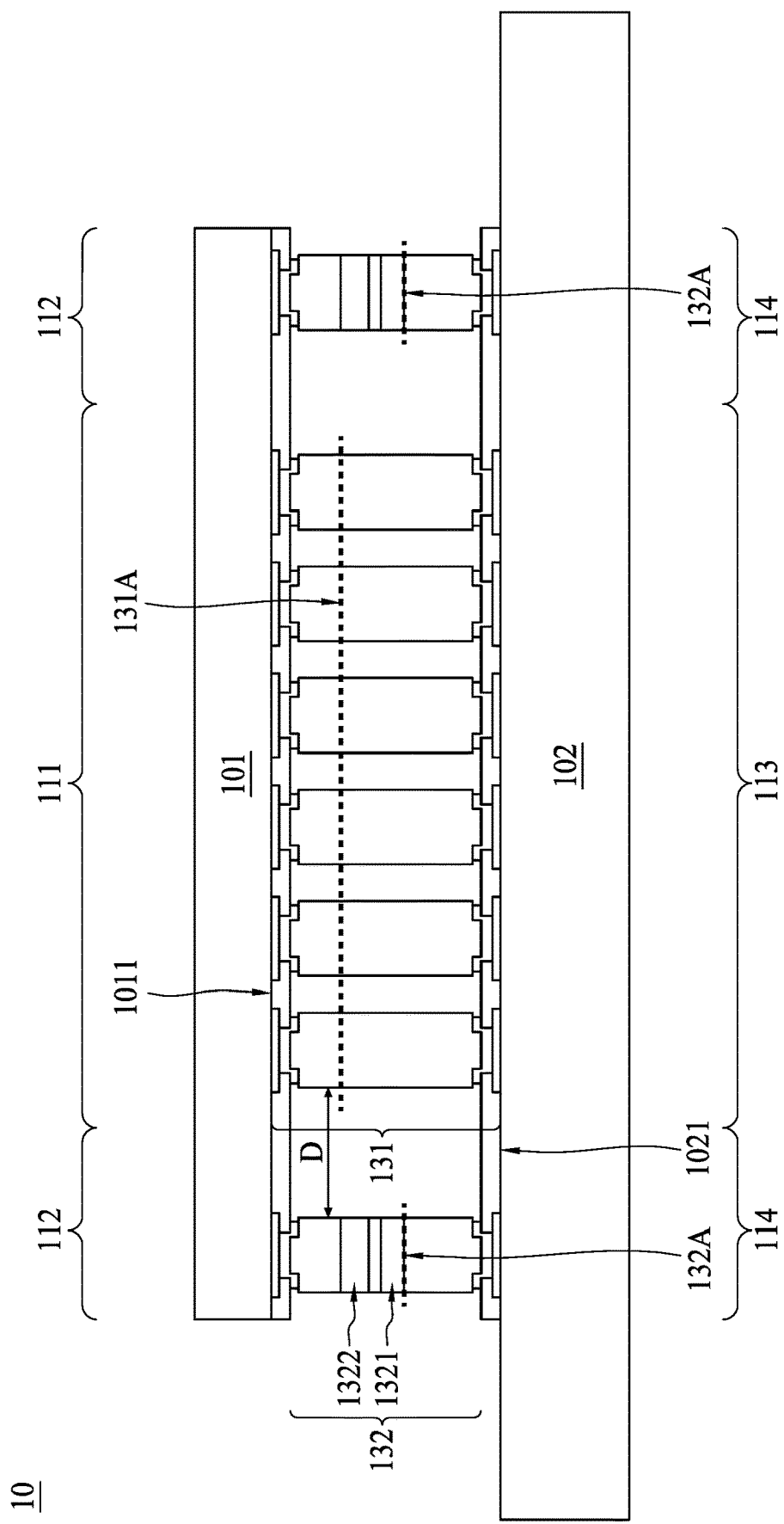
FIG. 1A illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Hybrid bonding, which includes metal-metal bonding and dielectric-to-dielectric bonding at a same surface, is adopted for high I/O count scenario and contact resistance reduction. However, complicated planarization operation is performed to control the extent of metal surface dishing prior to bonding operation so as to facilitate the bonding operation. For example, at least three chemical mechanical polishing (CMP) operations are performed to polish plated metal, sputtered seed layer, and the dielectric surface surrounding the metal and the seed layer. Surface roughness of the dielectric surface is important for the subsequent bonding operation. Generally speaking, dielectric-dielectric bonding occurs prior to metal-metal bonding, dielectric bonding strength can be difficult to control and may affect the quality of hybrid bonding. Moreover, specified alignment between metal-metal surface and dielectric-dielectric surface in hybrid bonding is considerably high, for example, within 1 µm processing window.

Present disclosure provides a semiconductor package structure with a bonding type with metal-metal interface in a narrower pitch region and metal-solder interface in a wider pitch region such that the complicated planarization operation, surface roughness control, and precise alignment in hybrid bonding can be relaxed. Metal-solder in the wider pitch region is to facilitate metal-metal interface alignment in the narrower pitch region. A method for manufacturing a semiconductor package structure with the aforesaid bonding type is also provided.

Referring to FIG. 1A, FIG. 1A illustrates a cross-sectional view of a semiconductor package structure 10 according to some embodiments of the present disclosure. The semiconductor package structure 10 includes a carrier 101 and a carrier 102 bonded thereto. The carrier 101 may include a first surface 1011 facing the carrier 102, and the carrier 102 may include a second surface 1021 facing the carrier 101. At least two regions can be identified on the first surface 1011, for example, a first region 111 connected to a first type conductive pillars 131 and a second region 112 connected to a second type conductive pillar 132. Composition of the first type conductive pillar 131 and the second type conductive pillar 132 is different, and the second type conductive pillar 132 may laterally surround the first type conductive pillar 131 as exemplified in FIG. 1A. In some embodiments, the first type conductive pillar 131 is closer to a center than to an edge of the carrier 101. In some embodiments, the first type conductive pillar 131 and the second type conductive pillar 132 each includes a plurality of conductive pillars. When indicating a first type conductive pillar 131 herein, one conductive pillar or a plurality of conductive pillars of the same type may be referred to. For example, a pitch of the first type conductive pillar 131, which is a distance between immediate adjacent first type conductive pillars 131, can be smaller than a pitch of the second type conductive pillar 132, which is a distance between immediate adjacent second type conductive pillars 132. In other words, the first type conductive pillar 131 is located in a narrower pitch region of the first surface 1011, and the second type conductive pillar 132 is located in a wider pitch region of the first surface 1011. In some embodiments, the pitch of the first type conductive pillar 131 is smaller than about 20 µm, for example, between 10 µm and 20 µm. In some embodiments, the pitch of the second type conductive pillar 132 is greater than about 20 µm, for example, between 20 µm and 40 µm.

Similarly, at least two regions can be identified on the second surface 1021, for example, a third region 113 connected to a first type conductive pillars 131 and a fourth region 114 connected to a second type conductive pillar 132. The third region 113 of the second surface 1021 is corresponding to the first region 111 of the first surface 1011 in a way that the first type conductive pillar 131 is connecting the first region 111 and the third region 113. The fourth region 114 of the second surface 1021 is corresponding to the second region 112 of the first surface 1011 in a way that the second type conductive pillar 132 is connecting the second region 112 and the fourth region 114. In some embodiments, the first type conductive pillar 131 is closer to a center than to an edge of the carrier 101. In some embodiments, the first type conductive pillar 131 and the second type conductive pillar 132 each includes a plurality of conductive pillars. For example, a pitch of the first type conductive pillar 131, which is a distance between immediate adjacent first type conductive pillars 131, can be smaller than a pitch of the second type conductive pillar 132, which is a distance between immediate adjacent second type conductive pillars 132. In other words, the first type conductive pillar 131 is located in a narrower pitch region of the second surface 1021, and the second type conductive pillar 132 is located in a wider pitch region of the second surface 1021. In some embodiments, the pitch of the first type conductive pillar 131 is smaller than about 20 µm, for example, between 10 µm and 20 µm. In some embodiments, the pitch of the second type conductive pillar 132 is greater than about 20 µm, for example, between 20 µm and 40 µm. In some embodiments, a distance D between adjacent first type conductive pillar 131 and second type conductive pillar 132 is greater than a pitch of the plurality of first type conductive pillars 131.

In some embodiments, the carrier 101 may be a semiconductor die having different regions I/O densities, for example, an application specific integrated circuit (ASIC) die, or a high bandwidth memory (HBM) die, or a semiconductor wafer having a plurality of die areas, each die areas having different regions I/O densities. In some embodiments, the carrier 102 may be a semiconductor die having different regions I/O densities or a semiconductor wafer having a plurality of die areas, each die areas having different regions I/O densities.

In some embodiments, the first type conductive pillar 131 is composed of a single conductive material, for example, copper. The first type conductive pillar 131 may include a copper-copper interface 131A closer to the first surface 1011 than to the second surface 1021. In some embodiments, the second type conductive pillar 132 is composed of a more than one conductive materials, including but not limited to, copper, solder (e.g., SnAg), or the like. In some embodiments, the second type conductive pillar 132 is composed of copper, solder (e.g., SnAg), and nickel. The second type conductive pillar 132 may include a copper-solder interface 132A closer to the second surface 1021 than to the first surface 1011. As a result, a contact resistance of the first type conductive pillar 131 is smaller than a contact resistance of the second type conductive pillar 132 due to the absence of heterogeneous interface, and that the resistance of copper is lower than the resistance of solder.

The second type conductive pillar 132 may include a first copper section proximal to the first surface 1011, a second copper section proximal to the second surface 1021, a solder (e.g., SnAg) section 1321 between the first copper section and the second solder section. As shown in FIG. 1A, a copper-solder interface 132A can be observed on the second type conductive pillar 132. In some embodiments, an adhesive section 1322, for example, a nickel section, is disposed between the first copper section and the solder section 1321. In some embodiments, a third copper section is disposed between the adhesive section 1322 and the solder section 1321.

In FIG. 1A, the copper-copper interface 131A on the first type conductive pillar 131 may be at a level different from that of the copper-solder interface 132A on the second type conductive pillar 132. For example, the copper-copper interface 131A may be closer to the first surface 1011 than to the second surface 1021, and the copper-solder interface 132A may be closer to the second surface 1021 than to the first surface 1011. In some embodiments, the first copper section of the second type conductive pillar 132 may possess a thickness of about 10 μm. In some embodiments, the second copper section of the second type conductive pillar 132 may possess a thickness of about 5 μm (not drawn in scale). In some embodiments, the copper section of the first type conductive pillar 131 between the first surface 1011 and the copper-copper interface 131A is about 10 μm. In some embodiments, the copper section of the first type conductive pillar 131 between the second surface 1021 and the copper-copper interface 131A is below 30 for example, between 28 μm and 30 μm.

Figure 1B:
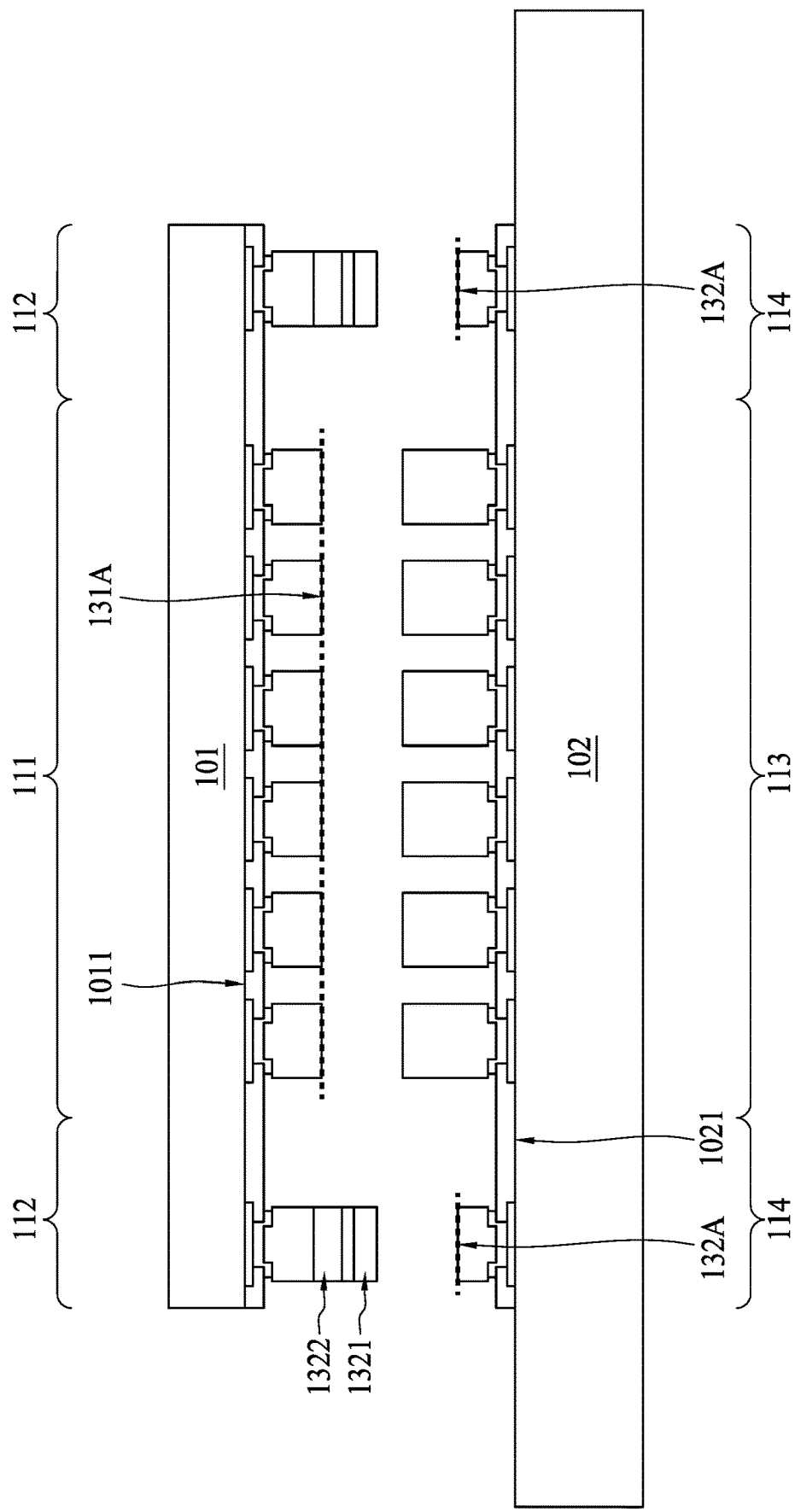
FIG. 1B illustrates a cross-sectional view of a semiconductor package structure prior to a bonding operation according to some embodiments of the present disclosure.

FIG. 1B illustrates a cross-sectional view of a semiconductor package structure prior to a bonding operation according to some embodiments of the present disclosure. In some embodiments, the carrier 101 may be a singulated functional die or a die region at wafer level, and the carrier 102 may be a bonding wafer. Prior to the bonding operation, the copper section of the intermediate conductive pillar in the second region 112 of the first surface 1011 possesses a thickness substantially identical to the copper section of the intermediate conductive pillar in the first region 111 of the first surface 1011. The intermediate conductive pillar in the second region 112 further includes an adhesive section 1322, for example, nickel, and a solder section 1321. On the other hand, prior to the bonding operation, the copper section of the intermediate conductive pillar in the third region 113 of the second surface 1021 possesses a thickness substantially greater than the copper section of the intermediate conductive pillar in the fourth region 114 of the second surface 1021. As illustrated in FIG. 1B, the copper-copper interface 131A and the copper-solder interface 132A are to be formed after the bonding operation.

During the bonding operation, the solder section 1321 is brought into contact with the copper section in the fourth region 114 of the second surface 1021, and the copper section in the first region 111 is brought into contact with the copper section in the third region 113 with suitable alignment and annealing operation. However, when misalignment occurs, for example, a center of the solder section 1321 is not overlapping with a center of the copper section on the second surface 1021, or a center of the copper section in the first region 111 is not overlapping with a center of the copper section in the third region 113, cohesive force of molten solder section 1321 may exert a pulling force on the intermediate conductive pillars on each regions of both dies, thereby aligning the intermediate conductive pillars under a self-assembly fashion.

Figure 2A:
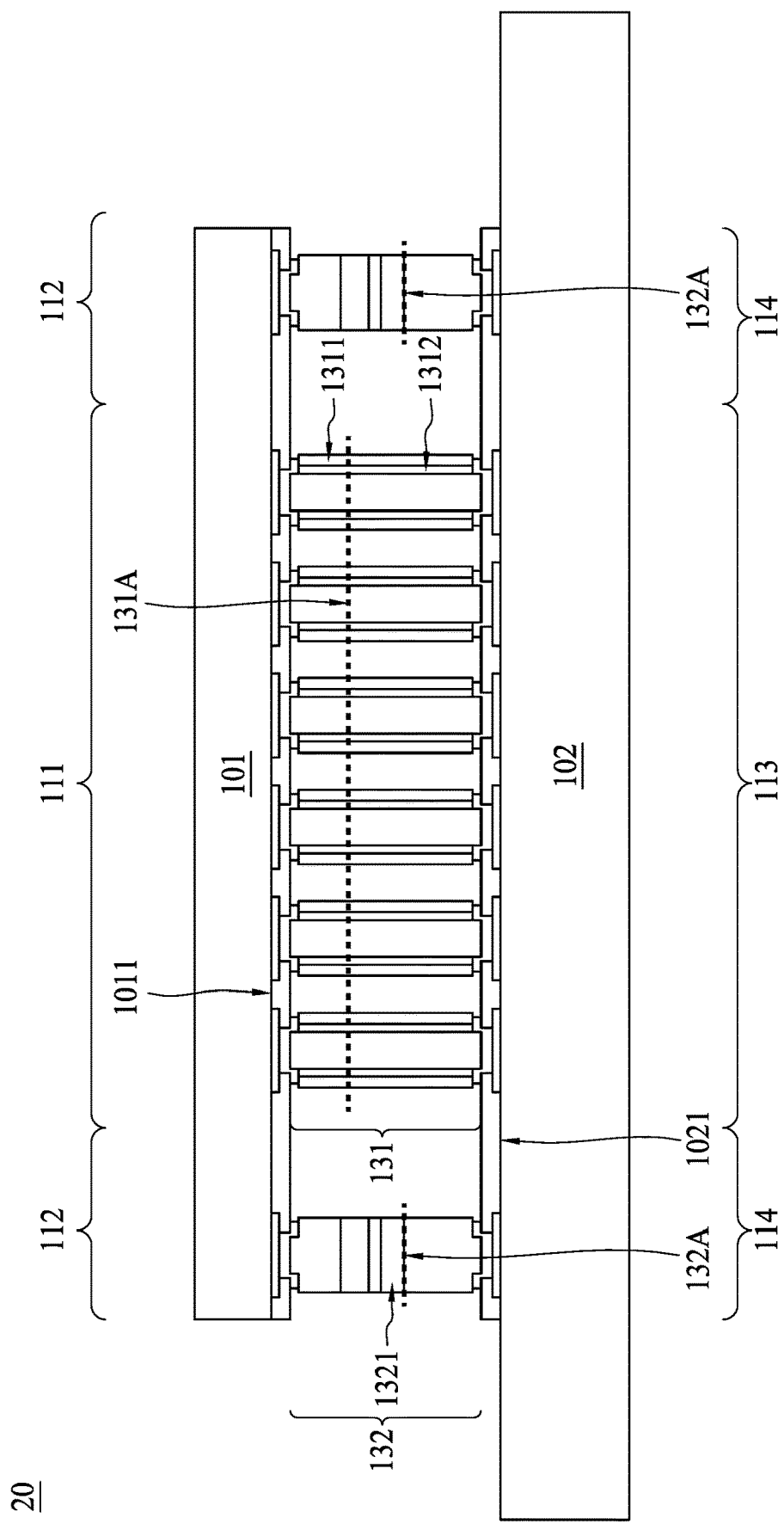
FIG. 2A illustrates a cross-sectional view of a semiconductor package structure according to some embodiments of the present disclosure.

FIG. 2A illustrates a cross-sectional view of a semiconductor package structure 20 according to some embodiments of the present disclosure. The semiconductor package structure 20 is similar to semiconductor package structure 10 but with the following differences. A sidewall of the first type conductive pillar 131 is coated with a solder layer 1311, for example, SnAg. In some embodiments, a copper-solder interface is formed in the first type conductive pillar 131 in that the sidewall of the first type conductive pillar 131 is in contact with the solder layer 1311, and possibly forming intermetallic compound at the interface. In some embodiments, an additional adhesion layer 1312, for example, nickel, is formed between the first type conductive pillar 131 and the solder layer 1311. In some embodiments, the copper-copper interface 131A on the first type conductive pillar 131 may be leveled with additional solder-solder interface and/or the nickel-nickel interface on the first type conductive pillar 131.

Figure 2B:
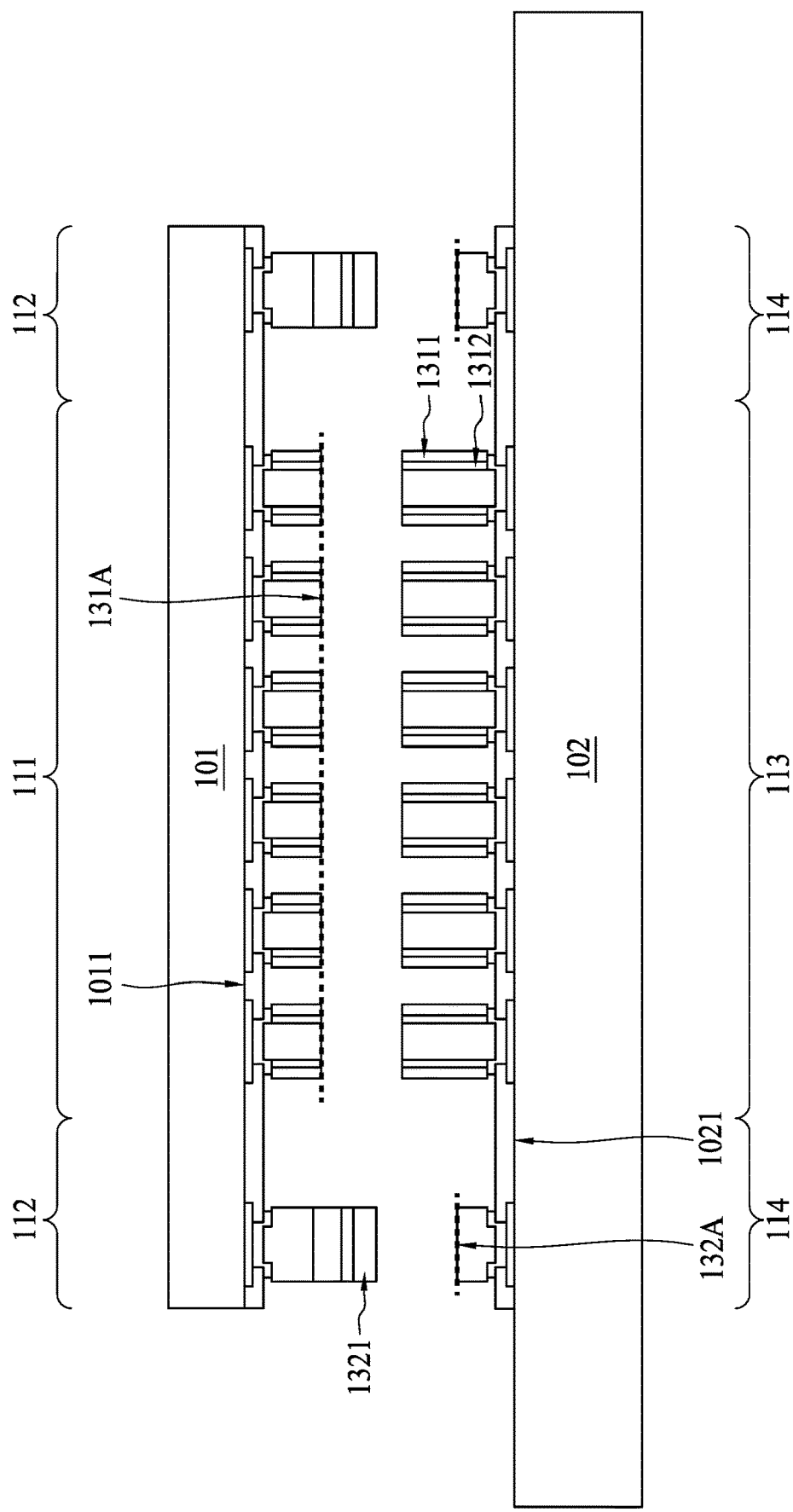
FIG. 2B illustrates a cross-sectional view of a semiconductor package structure prior to a bonding operation according to some embodiments of the present disclosure.

FIG. 2B illustrates a cross-sectional view of a semiconductor package structure prior to a bonding operation according to some embodiments of the present disclosure. In some embodiments, the carrier 101 may be a singulated functional die or a die region at wafer level, and the carrier 102 may be a bonding wafer. Prior to the bonding operation, the copper section of the intermediate conductive pillar in the second region 112 of the first surface 1011 possesses a thickness substantially identical to the copper section of the intermediate conductive pillar in the first region 111 of the first surface 1011. The intermediate conductive pillar in the second region 112 further includes an adhesive section 1322, for example, nickel, and a solder section 1321. On the other hand, prior to the bonding operation, the copper section of the intermediate solder-coated conductive pillar in the third region 113 of the second surface 1021 possesses a thickness substantially greater than the copper section of the intermediate conductive pillar in the fourth region 114 of the second surface 1021. As illustrated in FIG. 2B, the copper-copper interface 131A and the copper-solder interface 132A are to be formed after the bonding operation.

During the bonding operation, the solder section 1321 is brought into contact with the copper section in the fourth region 114 of the second surface 1021, and the solder-coated copper section in the first region 111 is brought into contact with the solder-coated copper section in the third region 113 with suitable alignment and annealing procedure. However, when misalignment occurs, for example, a center of the solder section 1321 is not overlapping with a center of the copper section on the second surface 1021, or a center of the solder-coated copper section in the first region 111 is not overlapping with a center of the solder-coated copper section in the third region 113, cohesive force of molten solder section 1321 and molten solder layer 1311 may exert a pulling force on the intermediate conductive pillars on each regions of both dies, thereby aligning the intermediate conductive pillars under a self-assembly fashion. In addition, if the copper-copper interface 131A is not formed with electrical connection or even with a contact resistance greater than desired, the solder layer 1311 can provide specified electrical connection after bonding.

Figure 3A:
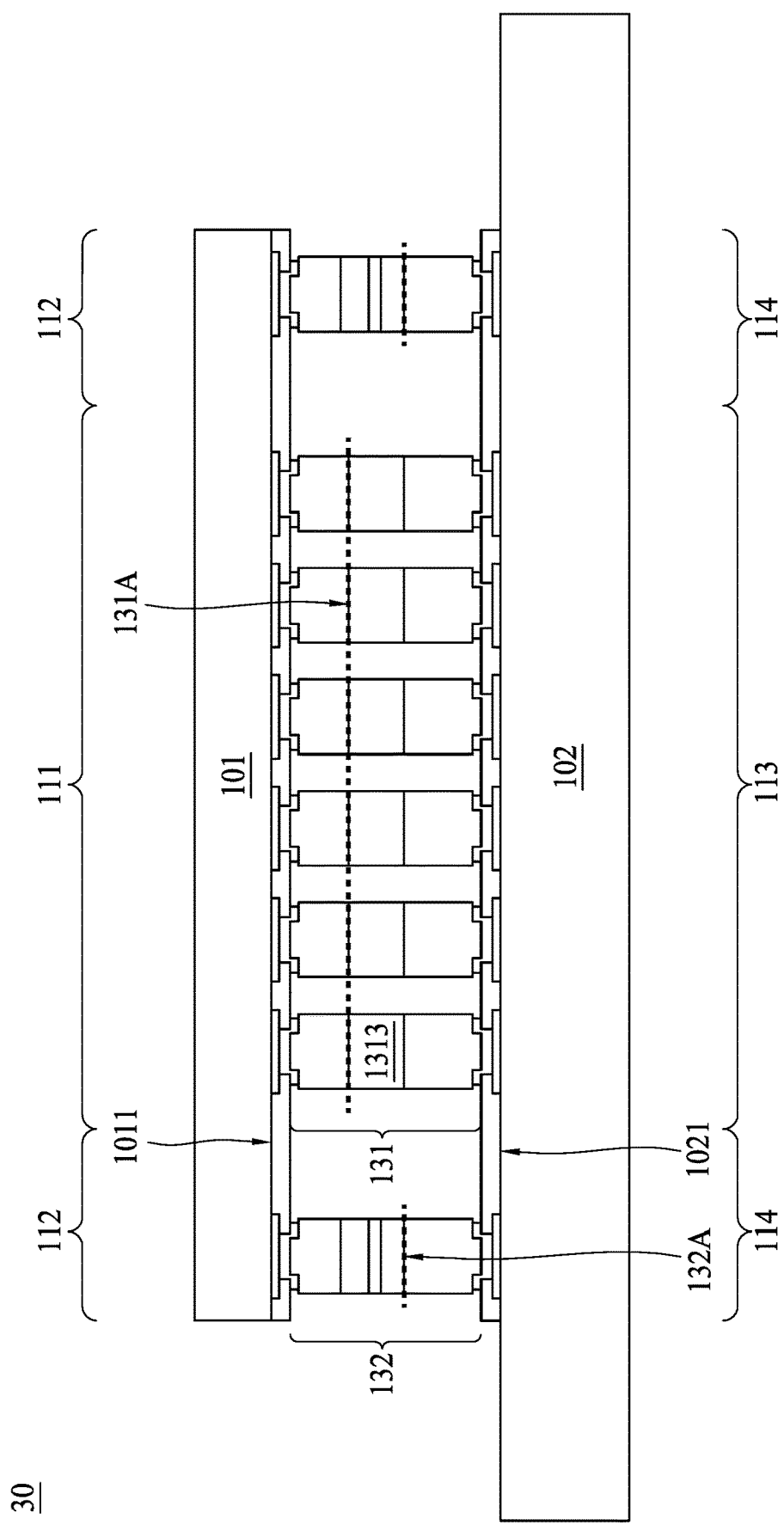
FIG. 3A illustrates a cross-sectional view of a semiconductor package structure according to some embodiments of the present disclosure.

FIG. 3A illustrates a cross-sectional view of a semiconductor package structure 30 according to some embodiments of the present disclosure. The semiconductor package structure 30 is similar to semiconductor package structure 10 but with the following differences. A copper paste section 1313 is between the copper section in the first region 111 of the first surface 1011 and the copper section in the third region 113 of the second surface 1021. FIG. 3A is to demonstrate the position of the copper paste and thus is not drawn to scale. Copper paste may be a thin layer connecting opposing copper sections. In some embodiments, copper paste is applied to reduce contact resistance if the opposing copper sections were not suitably bonded. Illustration of the aforesaid scenarios will be described in FIG. 3C1, FIG. 3C2, FIG. 3C3, and FIG. 3C4.

Figure 3B:
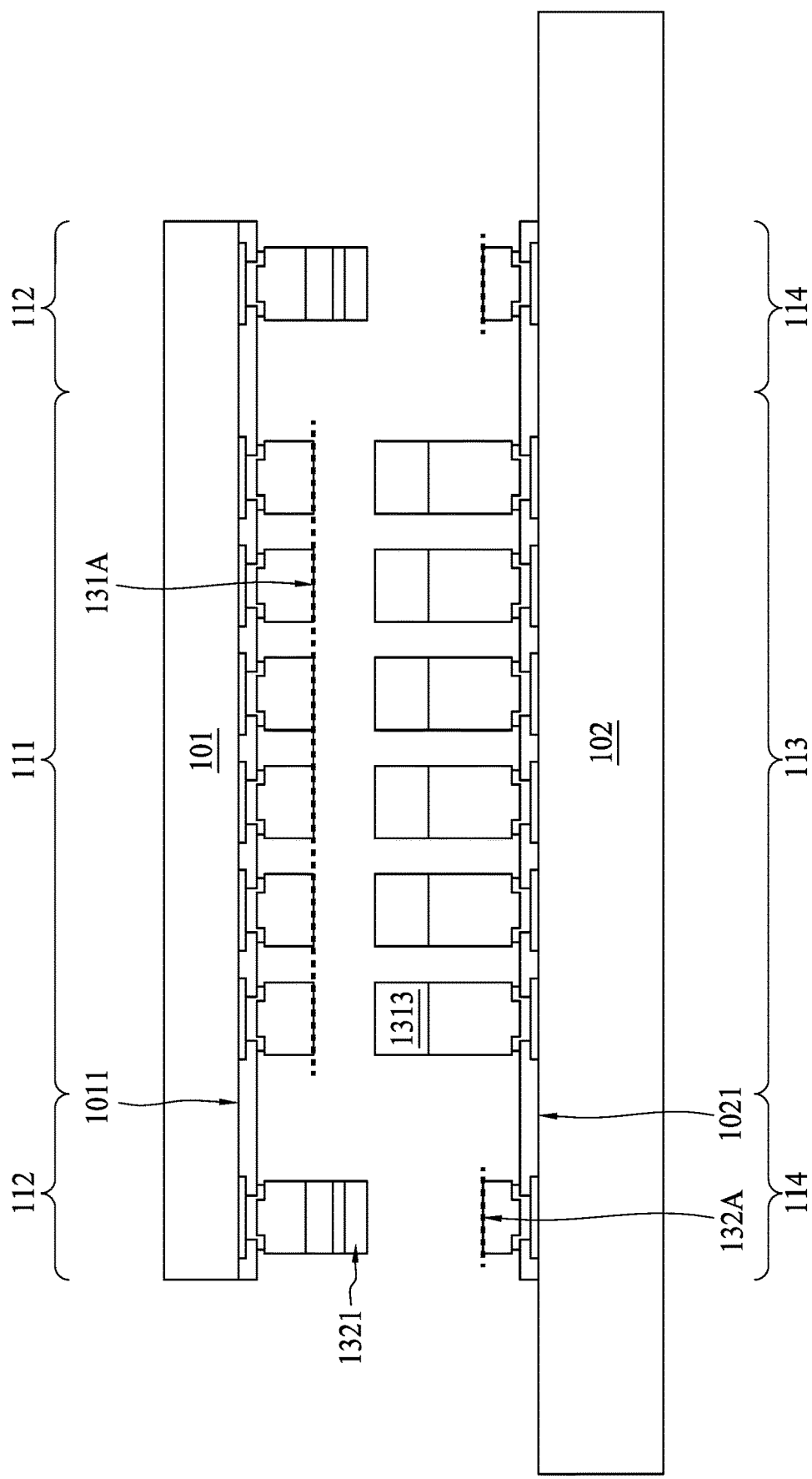
FIG. 3B illustrates a cross-sectional view of a semiconductor package structure prior to a bonding operation according to some embodiments of the present disclosure.

FIG. 3B illustrates a cross-sectional view of a semiconductor package structure prior to a bonding operation according to some embodiments of the present disclosure. In some embodiments, the carrier 101 may be a singulated functional die or a die region at wafer level, and the carrier 102 may be a bonding wafer. Prior to the bonding operation, the copper section of the intermediate conductive pillar in the second region 112 of the first surface 1011 possesses a thickness substantially identical to the copper section of the intermediate conductive pillar in the first region 111 of the first surface 1011. The intermediate conductive pillar in the second region 112 further includes an adhesive section 1322, for example, nickel, and a solder section 1321. On the other hand, prior to the bonding operation, the copper section of the intermediate solder-coated conductive pillar in the third region 113 of the second surface 1021 possesses a thickness substantially greater than the copper section of the intermediate conductive pillar in the fourth region 114 of the second surface 1021. As illustrated in FIG. 2B, the copper-copper interface 131A and the copper-solder interface 132A are to be formed after the bonding operation.

During the bonding operation, the solder section 1321 is brought into contact with the copper section in the fourth region 114 of the second surface 1021, and the copper section in the first region 111 is brought into contact with the copper section in the third region 113 with suitable alignment and annealing procedure. However, when misalignment occurs, for example, a center of the solder section 1321 is not overlapping with a center of the copper section on the second surface 1021, or a center of the copper section in the first region 111 is not overlapping with a center of the copper section with copper paste in the third region 113, cohesive force of molten solder section 1321 may exert a pulling force on the intermediate conductive pillars on each regions of both dies, thereby aligning the intermediate conductive pillars under a self-assembly fashion.

FIG. 3C1, FIG. 3C2, FIG. 3C3, and FIG. 3C4 illustrate cross sectional views of an intermediate semiconductor package structure during various manufacturing operations, according to some embodiments of the present disclosure. In FIG. 3C1, a plurality of copper sections 131' is formed on a carrier 301. In FIG. 3C2, the plurality of copper sections 131' are dipped into copper paste 300, forming a copper paste section 313 over each of the copper sections 131'. The carrier 301 is then brought into contact with another carrier 302 with corresponding copper sections 131" and conducting a bonding operation. The bonding operation may include an annealing process facilitating copper interdiffusion between opposing copper sections 131', 131". Situations where the misalignment between opposing copper sections 131', 131" may occur in that (1) a center of the copper section 131' may be shifted from a center of the copper section 131", (2) the copper section 131' may not be in contact with the copper section 131" after the annealing process so that a small seam gap is therebetween, (3) one of the copper sections 131', 131" may not be flat at the bonding surface so that a portion of the bonding surface is not connected to its counterpart, or the combinations of the above. With the presence of copper paste, the aforesaid situations which increase the contact resistance can be mitigated through the application of the cooper paste by providing additional conductive channel to the opposing copper sections.

Figure 4A:
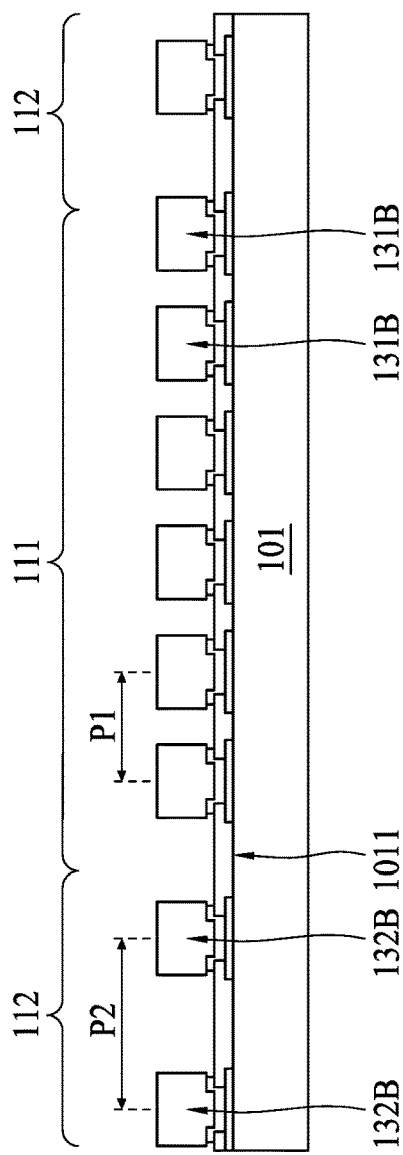
FIG. 4A, FIG. 4B, FIG. 4C, and FIG. 4D illustrate various manufacturing operations of a portion of a semiconductor package structure, according to some embodiments of the present disclosure.
Figure 4B:
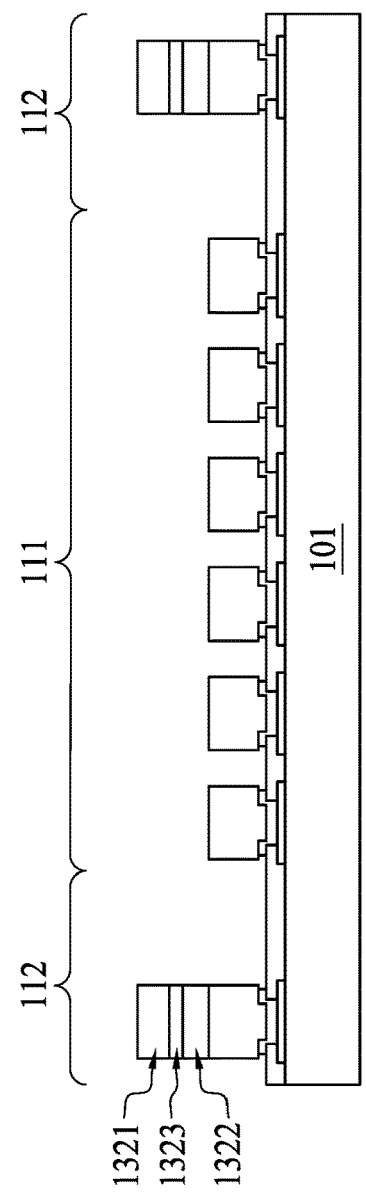
Figure 4C:
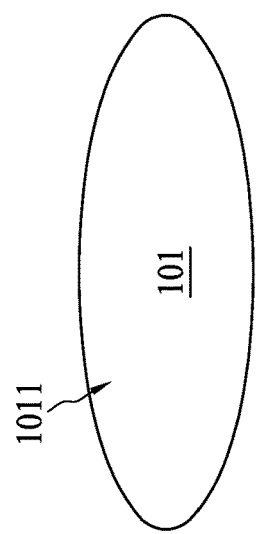
Figure 4D:
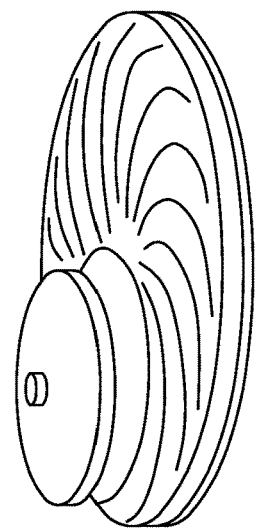

FIG. 4A, FIG. 4B, FIG. 4C, and FIG. 4D illustrate various manufacturing operations of a portion of a semiconductor package structure, according to some embodiments of the present disclosure. In FIG. 4A, a first carrier 101, for example, a first wafer with a first surface 1011, is provided. In FIG. 4B, a plurality of first conductive sections 131B and a plurality of second conductive sections 132B are formed over the first surface 1011. Particularly, the conductive sections 131B are formed in a first region 111 on the first surface 1011 with a pitch P1, and the conductive sections 132B are formed in a second region 112 on the first surface 1011 with a pitch P2. The pitch P1 is smaller than the pitch P2. In some embodiments, the first region 111 is the dense region within a die, and the second region 112 is an isolation region within the same die. In FIG. 4C, a planarization operation is performed to planarize the first conductive section 131B and the second conductive section 132B. In some embodiments, the planarization operation includes a chemical mechanical polishing (CMP) flattening the top surfaces of the first conductive section 131B and the second conductive section 132B. In FIG. 4D, a solder section 1321, for example, a solder bump, is selectively formed over the second conductive sections 132B in the second region 112. The solder section 1321 can be formed by electroplating, electroless plating, or printing operations. In the semiconductor package structure 20 of FIG. 2A and FIG. 2B, the solder section 1321 is selectively formed over the second conductive sections 132B in the second region 112 and solder layer 1311 is formed at the sidewall of the first conductive section 131B. In some embodiments, the solder section 1321 and the solder layer 1311 can be formed in a single operation or in separate operations. In some embodiments, an adhesion section 1322 is formed over the second conductive section 132B prior to the solder section 1321. In some embodiments, a copper section 1323 is formed over the adhesion section 1322 prior to the solder section 1321.

FIG. 5A, FIG. 5B, FIG. 5C, and FIG. 5D illustrate various manufacturing operations of a portion of a semiconductor package structure, according to some embodiments of the present disclosure. In FIG. 5A, a second carrier 102, for example, a second wafer with a second surface 1021, is provided. In FIG. 5B, a plurality of third conductive sections 131C and a plurality of fourth conductive sections 132C are formed over the second surface 1021. Particularly, the third conductive sections 131C are formed in a third region 113 on the second surface 1021 with a pitch P1, and the fourth conductive sections 132C are formed in a fourth region 114 on the second surface 1021 with a pitch P2. The pitch P1 is smaller than the pitch P2. In some embodiments, the third region 113 is the dense region within a die, and the fourth region 114 is an isolation region within the same die. In FIG. 5C, a planarization operation is performed to selectively planarize the third conductive section 131C. In some embodiments, the planarization operation includes a chemical mechanical polishing (CMP) flattening the top surfaces of the third conductive section 131C. In FIG. 5D, optionally, a plasma activation 501 operation is performed over the third conductive section 131C and the fourth conductive section 132C on the second wafer 102 in order to enhance the copper-copper bonding strength.

Figure 6A:
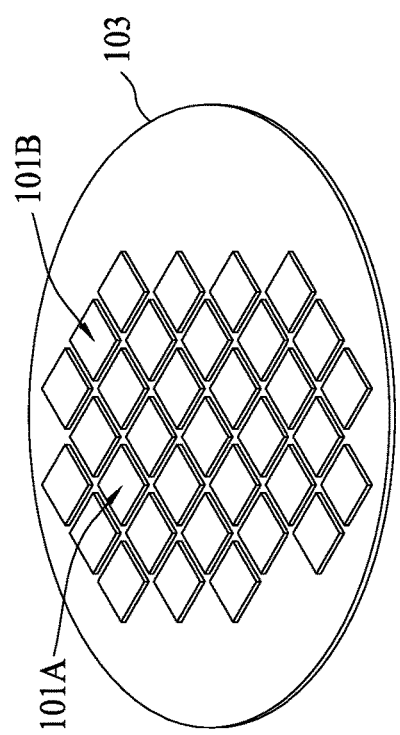
FIG. 6A, FIG. 6B, FIG. 6C, and FIG. 6D illustrate various manufacturing operations of a portion of a semiconductor package structure, according to some embodiments of the present disclosure.
Figure 6B:
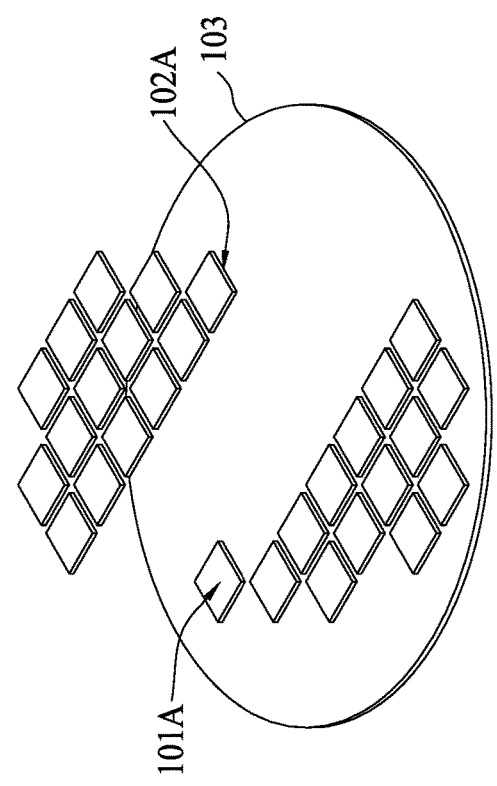
Figure 6C:
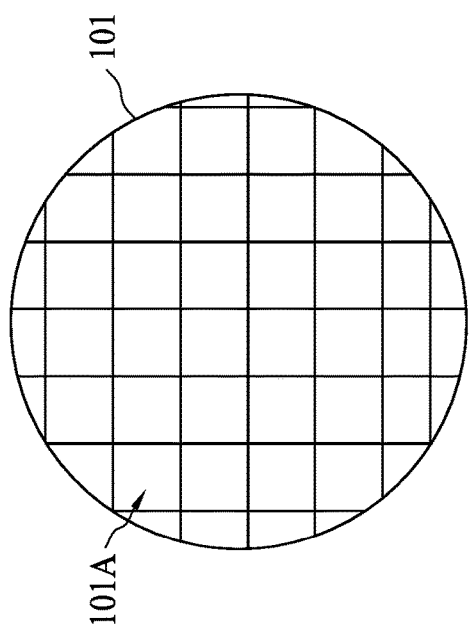
Figure 6D:
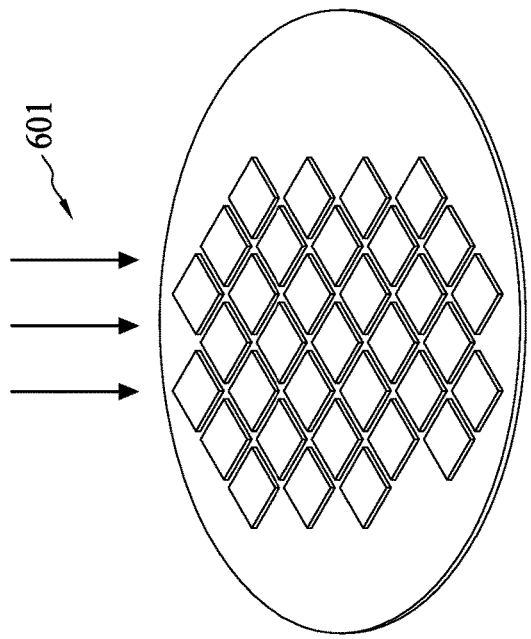

FIG. 6A, FIG. 6B, FIG. 6C, and FIG. 6D illustrate various manufacturing operations of a portion of a semiconductor package structure, according to some embodiments of the present disclosure. FIG. 6A to FIG. 6D exemplify a method for bonding dies from the first carrier 101 and the second carrier 102. In FIG. 6A, the first carrier 101 includes a plurality of semiconductor dies 101A. Each of the semiconductor dies 101A includes a first region 111 and a second region 112 previously described in FIG. 4B. In FIG. 6B, the plurality of semiconductor dies 101A are diced from the first carrier 101 and placed over a third carrier 103. In some embodiments, other type of semiconductor dies 101B diced from another carrier may also be placed over the third carrier 103 with the semiconductor dies 101A and forming a mixed die integration. Optionally, in FIG. 6C, plasma activation 601 can be performed over the semiconductor dies on the third carrier 103. In FIG. 6D, semiconductor dies 102A diced from the second carrier 102 can be bonded to the semiconductor dies on the third carrier 103 and complete a die-to-wafer bonding operation. Each of the second conductive section 132B on the semiconductor die 101A is bonded to the fourth conductive section 132C on the semiconductor die 102A by a reflow operation facilitating the solder joint. Alternatively, the second carrier 102 is bonded to the third carrier 103 with mixed dies prior to dicing the second carrier 102 into individual semiconductor dies 102A. Alternatively, the first wafer 101 is bonded to the second wafer 12 without dicing any of the wafer into individual dies. Following the reflow operation, each of the first conductive sections 131B on the first surface 101I is connected to each of the third conductive sections 131C by an annealing operation to facilitate copper-copper diffusion at the copper-copper interface.

Figure 7A:
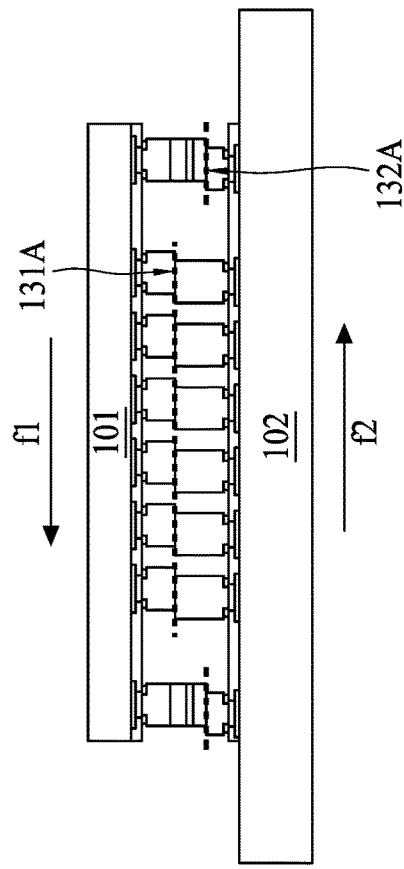
FIG. 7A, FIG. 7B, and FIG. 7C illustrate cross sectional views of an intermediate semiconductor package structure during various manufacturing operations, according to some embodiments of the present disclosure.
Figure 7B:
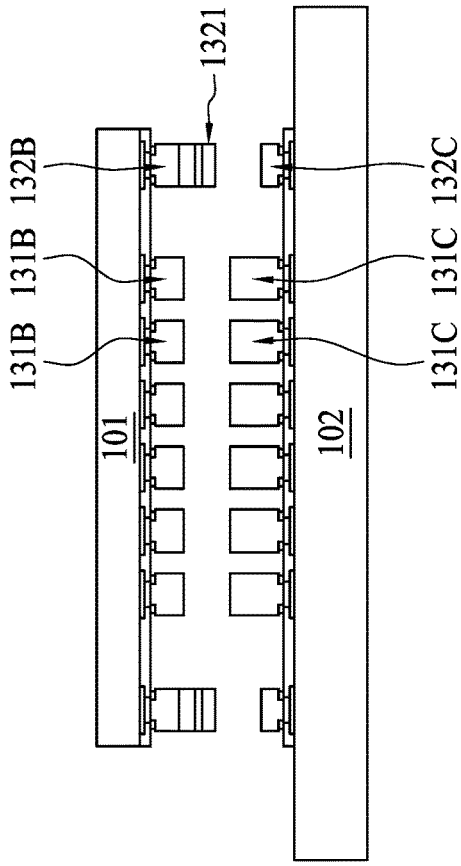
Figure 7C:
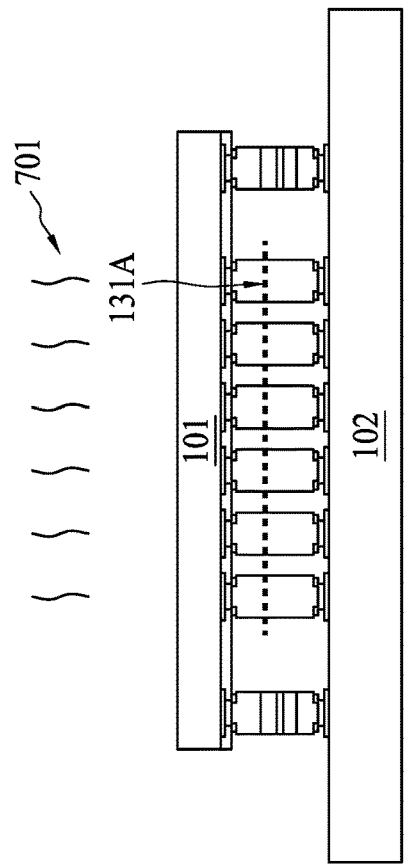

FIG. 7A, FIG. 7B, and FIG. 7C illustrate cross sectional views of an intermediate semiconductor package structure during various manufacturing operations, according to some embodiments of the present disclosure. In FIG. 7A, the first carrier 101 is bonded to the second carrier 102 by first connecting each of the second conductive section 132B to each of the fourth conductive section 132C by a reflow operation. The reflow operation allows the solder section on the second conductive section 132B to be molten and connected to the fourth conductive section 132C counterpart. As illustrated in FIG. 7B, when misalignment occurs between corresponding conductive sections on the first carrier 101 and the second carrier 102, the cohesive force of the molten solder may exert a horizontal pulling forces f1 and f2 to opposing carriers and align the two in a self-assembly fashion. In FIG. 7C, an annealing operation is performed after the self-alignment to foster copper-copper diffusion at the copper-copper interface 131A and facilitate the bonding process. Subsequent to FIG. 7C, the first carrier 101 and the second carrier 102 can be singulated and a plurality of semiconductor package structures are formed.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
    a first carrier having a first surface, the first surface comprising a first region and a second region;
    a second carrier having a second surface opposing the first surface, the second surface comprising a third region corresponding to the first region and a fourth region corresponding to the second region;
    a plurality of first type conductive pillars directly connecting the first region of the first surface to the third region of the second surface; and
    a plurality of second type conductive pillars between the second region of the first surface and the fourth region of the second surface;
    wherein a contact resistance of each of the first type conductive pillars is lower than a contact resistance of each of the second type conductive pillars.

2. The semiconductor package structure of claim 1, wherein each of the plurality of first type conductive pillars comprises a copper-copper interface.

3. The semiconductor package structure of claim 2, wherein each of the plurality of second type conductive pillars comprises a copper-solder interface.

4. The semiconductor package structure of claim 1, wherein a pitch of the first type conductive pillars in the first region is smaller than a pitch of the second type conductive pillars in the second region.

5. The semiconductor package structure of claim 4, wherein the pitch of the first type conductive pillars in the first region is smaller than 20 μm.

6. The semiconductor package structure of claim 1, wherein a sidewall of each of the first type conductive pillars further comprises a solder coating.

7. The semiconductor package structure of claim 1, wherein the first carrier comprises a semiconductor die, and the first region of the first surface is closer to a center than to an edge of the semiconductor die.

8. A semiconductor package structure, comprising:
a first semiconductor die surface having a narrower pitch region and a wider pitch region adjacent to the narrower pitch region;
a second semiconductor die surface having a narrower pitch region corresponding to the narrower pitch region of the first semiconductor die surface;
a plurality of first type conductive pillars in the narrower pitch region and directly connecting the narrower pitch region of the first semiconductor die surface to the narrower pitch region of the second semiconductor die surface, each of the first type conductive pillars having a copper-copper interface; and
a plurality of second type conductive pillars in the wider pitch region, each of the second type conductive pillars having a copper-solder interface, wherein the plurality of first type conductive pillars comprises a first type conductive pillar, the plurality of second type conductive pillars comprises a second type conductive pillar adjacent to the first type conductive pillar, and a distance between the first type conductive pillar and the second type conductive pillar adjacent to the first type conductive pillar is greater than a pitch of the plurality of first type conductive pillars.

9. The semiconductor package structure of claim 8, wherein the copper-copper interface is at a level different from the copper-solder interface.

10. The semiconductor package structure of claim 8, wherein a pitch of the plurality of second type conductive pillars is between 20 μm and 40 μm.

11. The semiconductor package structure of claim 8, wherein a sidewall of each of the first type conductive pillars further comprises a solder coating.

12. The semiconductor package structure of claim 1, wherein each of the first type conductive pillars comprises a single conductive material, and each of the second type conductive pillars comprises at least two conductive materials.

13. The semiconductor package structure of claim 2, further comprising a copper paste section covering the coper-copper interface.

14. The semiconductor package structure of claim 3, wherein each of the plurality of second type conductive pillars further comprises an adhesive layer between copper and solder.

15. The semiconductor package structure of claim 6, further comprising an adhesive layer between the sidewall of each of the first type conductive pillars and the solder coating.

16. The semiconductor package structure of claim 8, further comprising a copper paste section covering a portion of sidewalls of the first type conductive pillars.

17. The semiconductor package structure of claim 8, wherein the copper-copper interface and the copper-solder interface are at different elevations.

18. The semiconductor package structure of claim 8, wherein each of the second type conductive pillars comprises a first copper section proximal to the semiconductor die surface, a second copper section proximal to the copper-solder interface, and a solder section between the first copper section and the second copper section.

19. The semiconductor package structure of claim 18, wherein each of the second type conductive pillars further comprises an adhesive section between the first copper section and the solder section.

20. The semiconductor package structure of claim 1, wherein the second type conductive pillars are laterally positioned around the first type conductive pillars.

* * * * *